United States Patent [19]

Mortensen

[11] Patent Number: 5,246,872
[45] Date of Patent: Sep. 21, 1993

[54] ELECTROSTATIC DISCHARGE PROTECTION DEVICE AND A METHOD FOR SIMULTANEOUSLY FORMING MOS DEVICES WITH BOTH LIGHTLY DOPED AND NON LIGHTLY DOPED SOURCE AND DRAIN REGIONS

[75] Inventor: Gordon L. Mortensen, San Jose, Calif.

[73] Assignee: National Semiconductor Corporation, Santa Clara, Calif.

[21] Appl. No.: 906,982

[22] Filed: Jun. 30, 1992

Related U.S. Application Data

[62] Division of Ser. No. 648,661, Jan. 30, 1991, Pat. No. 5,208,475.

[51] Int. Cl.$^5$ .................................. H01L 21/70
[52] U.S. Cl. ............................ 437/51; 437/44; 437/54; 437/56
[58] Field of Search ............... 437/51, 54, 56, 59, 437/44

[56] References Cited

U.S. PATENT DOCUMENTS

| | | | |
|---|---|---|---|
| 4,692,834 | 9/1987 | Iwahashi et al. | 361/91 |
| 4,811,155 | 3/1989 | Kuriyama et al. | 361/56 |
| 4,829,350 | 5/1989 | Miller | 357/23.13 |
| 4,855,620 | 8/1989 | Duvvury et al. | 307/448 |

FOREIGN PATENT DOCUMENTS 161446  11/1985  European Pat. Off. ............... 437/51

OTHER PUBLICATIONS

Yang, Edward S., "Microelectronic Devices," McGraw Hill, 1988, pp. 292-294.

*Primary Examiner*—Brian E. Hearn
*Assistant Examiner*—Kevin M. Picardat
*Attorney, Agent, or Firm*—Townsend and Townsend Khourie and Crew

[57] ABSTRACT

An electrostatic discharge protection circuit having a non-lightly doped drain MOS device for protecting other lightly doped drain devices on an integrated circuit, and a method of concurrently fabricating both the non lightly doped and lightly doped devices on the substrate of the integrated circuit using substantially the same set of processing steps.

9 Claims, 5 Drawing Sheets

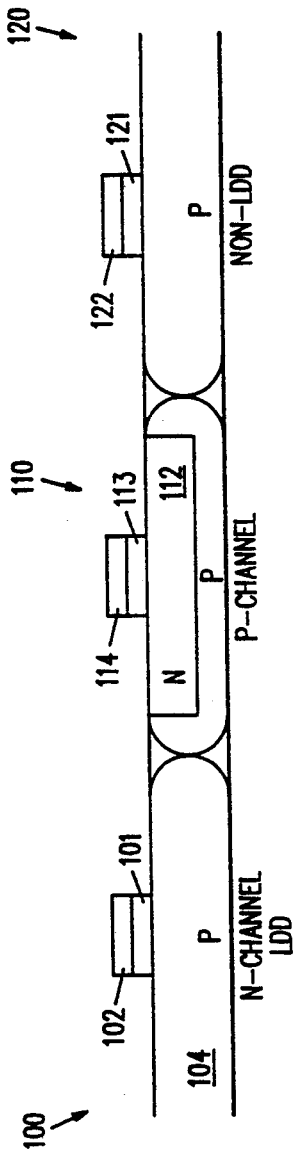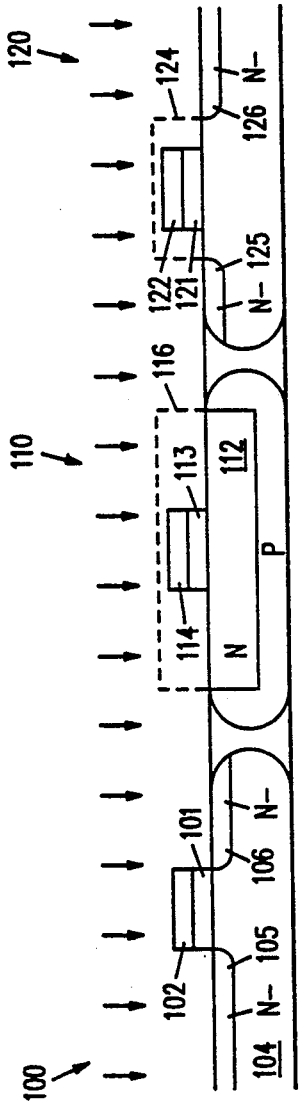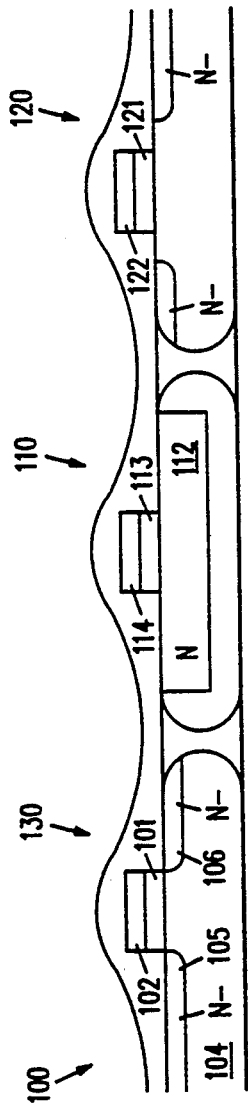

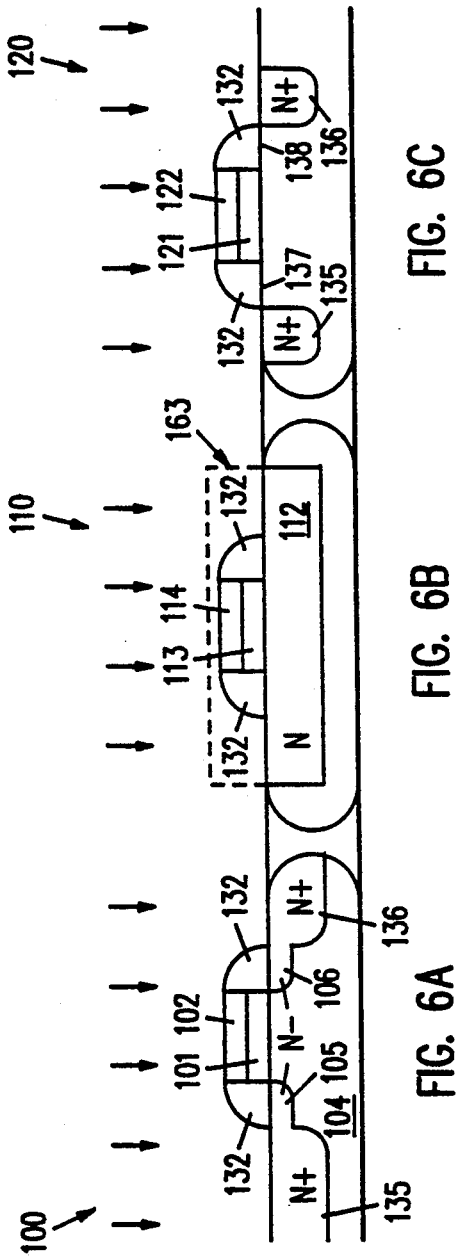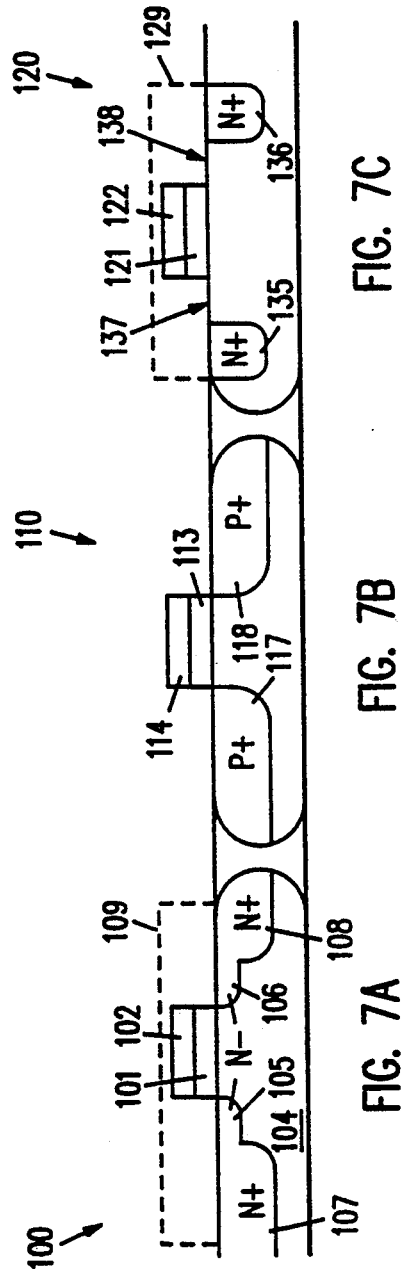

ELECTROSTATIC DISCHARGE PROTECTION DEVICE AND A METHOD FOR SIMULTANEOUSLY FORMING MOS DEVICES WITH BOTH LIGHTLY DOPED AND NON LIGHTLY DOPED SOURCE AND DRAIN REGIONS

This is a division of application Ser. No. 07/648,661 filed Jan. 30, 1991 now U.S. Pat. No. 5,208,475.

BACKGROUND OF THE INVENTION

1. Field of the Invention

The present invention relates to an electrostatic discharge protection circuit which uses a MOS device with non-lightly doped source and drain regions for protecting other MOS devices with lightly doped source and drain regions on an integrated circuit.

2. Description of the Prior Art

Integrated circuits (ICs) are susceptible to damage due to electrostatic discharge (ESD). An ESD event occurs whenever a packaged IC is subject to the dissipation of static electricity, which may occur whenever the pins of the IC come into contact with another surface. Thus, the likelihood of an ESD event damaging or destroying an IC is substantial during packaging and handling of the IC.

The human body is a major source of static charge. The human body can be modeled as a 100 pico-farad capacitor capable of storing 3.0 KV and having series resistance of 1.5 K ohms. When the pins of the packaged IC are touched, a peak current equal to 3.0 KV/1.5 K ohms=2 amps is passed through the MOS devices on the IC. With ICs having MOS devices with one micron or less geometries, discharges of 2 amps or less may damage or even destroy the gate oxides of the MOS devices on the IC if adequate ESD protection is not provided.

The consequences of ESD damage can be severe. The internal circuitry of the IC may be completely destroyed, rendering the device useless. More than half of the ICs returned by customers are due to ESD damage. Perhaps of even greater consequence, the ESD event may render the IC only partially inoperative. If undetected, the IC may be installed into a final product, where, after subsequent use, the damaged circuit may degenerate and eventually cause complete IC failure.

U.S. Pat. Nos. 4,829,350, 4,811,155, 4,855,620 and 4,692,834 all disclose ESD protection circuits in which the channel of an MOS device is coupled between ground and a pin of the IC. Such an MOS device has a parasitic bipolar transistor coupled in parallel with the MOS device. When a positive ESD event occurs at the pin, the bipolar transistor is forward-activated, and a substantial portion of the ESD current is passed through it to ground. Similarly, in the event of a negative ESD occurrence with respect to the pin or ground, the parasitic bipolar transistor is reverse-activated, and the ESD current is passed through it from ground to the pin.

State of the art CMOS devices currently have a channel width of approximately 0.8 microns. For one micron or smaller CMOS process flows, lightly doped regions are provided between the gate and the source and drain respectively for the N channel devices. The advantages of these lightly doped regions are set forth in *Microelectronic Devices*, Edward S. Yang, McGraw Hill, 1988, pp. 292-294.

Referring to FIG. 1, a cross section of an MOS device with lightly doped source and drain regions regions is shown. The MOS device 10, fabricated on a substrate 12, includes a gate 14, a gate oxide 16, a channel 18, a highly doped (N+) source 20, a first lightly doped (N−) region 22, a highly doped (N+) drain 24, and a second lightly doped (N−) region 26. When the MOS device is turned on, a depletion region 28 is formed along the channel 18. It is well known that the source and drain regions of an MOS device are interchangeable, and therefore both the first and second lightly doped regions 22 and 26 are hereinafter referred to as lightly doped drain (LDD) regions.

It is important to note that in IC fabrication processes, one set of masks are used to create all the devices on an IC. Therefore, if MOS devices with LDD regions are used for circuit design, the other IC devices, such as those dedicated for ESD protection, are also MOS devices with LDD regions. Thus, current one micron or less CMOS ICs use similar ESD protection circuits as described in the aforementioned prior art patents, except the MOS devices of the prior art are replaced with MOS devices with LDD regions.

Referring to FIG. 2, a prior art ESD protection circuit using an MOS device with LDD regions is shown. The circuit includes the channel of the LDD MOS device 10 coupled between the pin 32 and ground. The LDD MOS device 10 is configured so that the source 20 and first lightly doped region 22 are coupled to pin 32, and the drain 24 an second lightly doped region 26 are coupled to ground. Capacitor (Cgs) represents the capacitance between the source and the gate, capacitor (Cgd) represents the capacitance between the drain and gate and R represents the gate to ground resistance.

A parasitic bipolar transistor 36 is also coupled between line 34 and ground. The emitter 37 of the bipolar transistor corresponds to the second (N−) region 26 and drain 24, the base corresponds to the channel 18, and the collector 39 corresponds to the first (N−) region 22 and the source 20. Since the source and drain regions of the MOS device are readily interchangeable, the emitter and the collector of the parasitic bipolar transistor 36 are also interchangeable.

In the event of a positive (with respect to ground) ESD with a magnitude (V) occurs at pin 32, the ESD induces the MOS transistor 10 and its parasitic bipolar transistor 36 to breakdown and to be biased into a conductive state. Both breakdown and the biasing actions of the transistors are responsible for dissipating the ESD.

If the voltage (V) is large enough, breakdown between the first and second (N−) LDD regions of MOS transistor 10 may occur, creating the depletion region 28 across the channel 18 of the MOS device. As a result, electrons are swept out of the channel 18 toward the pin 32, thereby dissipating the ESD event to ground. This phenomena can also be described in view of the parasitic bipolar transistor 36. If the ESD event at pin 32 is large enough, the PN diode between the (N−) emitter 37 and the P base breaks down. As a result, electrons in the emitter are swept across the base 38 and to the collector 39. Thus, the positive ESD is dissipated to ground.

It is believed a voltage of approximately (V/2) is simultaneously applied to the gate 14 of the LDD MOS device 10 through capacitor C1. The voltage applied to the gate turns on the MOS device which enhances the formation of the depletion region 28 across channel region 18, and thus compliments the flow of electrons from the second LDD region 24 across the depletion region from ground to the pin 32. This second phenomena can also be described in view of the parasitic bipolar transistor 36. The voltage (V/2) applied to the base 38 biases the bipolar transistor 36 into the forward active state. As a result, electrons are emitted from the emitter 37 and collected at the collector 39 coupled to pin 32. Thus the positive ESD is dissipated to ground.

Similarly, in the event of a negative ESD occurrence at the pin with respect to the pin or ground, a channel is again formed between the source and drain and the MOS device is turned on. With respect to parasitic bipolar transistor 36, the transistor is reverse-activated in a manner opposite that described above. As a result, the negative ESD is dissipated from ground to the pin.

Although for reasons not completely understood, it is believed the majority of the ESD is dissipated through the action of the parasitic bipolar device 36 rather than that of the MOS device It is believed that because the MOS channel current is much smaller than the bipolar device, the majority of the ESD is dissipated through the action of the parasitic bipolar transistor 36.

For one micron or smaller devices, LDD MOS devices are not effective for ESD protection for several reasons. First, with the (N−) LDD regions 22 and 26, a larger voltage is required to induce breakdown than if an (N+) region was present in its place. Thus, the protection circuit maybe destroyed before being activated. Second, once the bipolar transistor 36 is turned on, the efficiency of the (N−) emitter (either region 22 or 26) of the parasitic bipolar transistor 36 is much lower than that of a similarly configured bipolar device with an (N+) emitter. Once activated, the number of electrons that can be emitted from the (N−) emitter is significantly smaller, thereby reducing the amount of ESD induced current it can handle.

In summary, the combination of the very thin gate oxides used in one micron or smaller CMOS devices as well as the lack of adequate ESD protection, renders such integrated circuits highly susceptible to ESD induced damage or destruction.

SUMMARY OF THE INVENTION

The present invention relates to an electrostatic discharge protection circuit which uses a MOS device with non-lightly doped source and drain regions for protecting other MOS devices with lightly doped source and drain regions on an integrated circuit. The non-LDD device is formed using the same set of processing steps that are used to build the other LDD MOS devices, and therefore does not require any additional processing steps or masks.

The non-LDD MOS device is desirable for ESD protection because it overcomes the problems associated with using MOS devices with LDD regions for an ESD protection circuit. In particular, when used in a protection circuit, the highly doped (N+) source and drain regions of the non LDD MOS device provides a parasitic bipolar transistor with a reduced diode breakdown threshold. As a result, the protection circuit is activated at smaller magnitudes of ESD. Second, once the non LDD MOS device is activated, the highly doped (N+) source and drain regions have a much greater parasitic bipolar transistor emitter efficiency than the MOS devices with LDD regions. The amount of ESD that can be dissipated is therefore greatly increased.

BRIEF DESCRIPTION OF THE DRAWINGS

FIGS. 3A through 3C are a cross-section view of an N channel LDD device, a complementary P channel device, and a non-LDD device respectively after the gates of each device have been formed according to the present invention.

FIGS. 4A through 4C are a cross-section view of the N channel LDD device, the complementary P channel device, and the non-LDD device respectively after a first dopant implant step according to the present invention.

FIGS. 5A through 5C are a cross-section view of the N channel LDD device, the complementary P channel device, and the non-LDD device respectively after a blanket oxidation step.

FIGS. 6A through 6C are a cross section view of the N channel LDD device, the complementary P channel device, and the non-LDD device respectively after a second dopant implant step.

FIGS. 7A through 7C are a cross section of the N channel LDD device, the complementary P channel device, and the non-LDD device respectively upon completion of the fabrication process.

DETAILED DESCRIPTION OF THE PREFERRED EMBODIMENT

Figure 1:
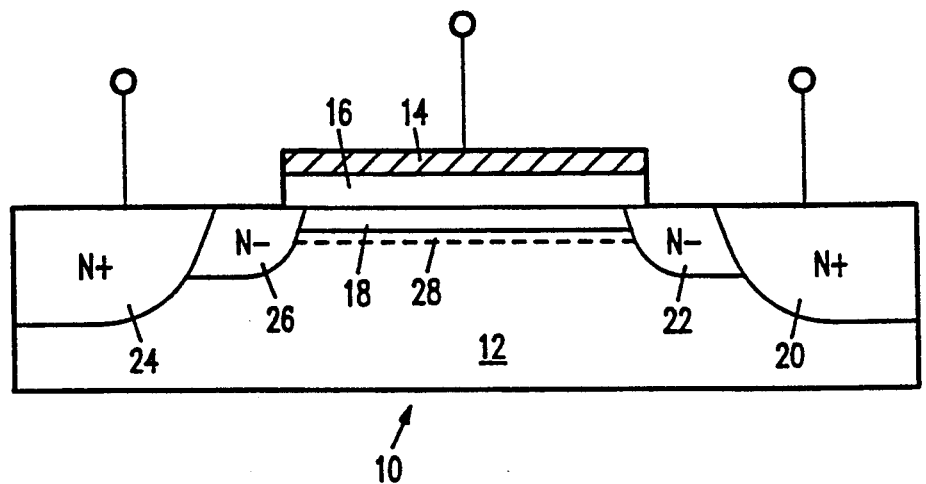
FIG. 1 is a cross section of an N channel lightly doped drain (LDD) MOS device according to the prior art.
Figure 2:
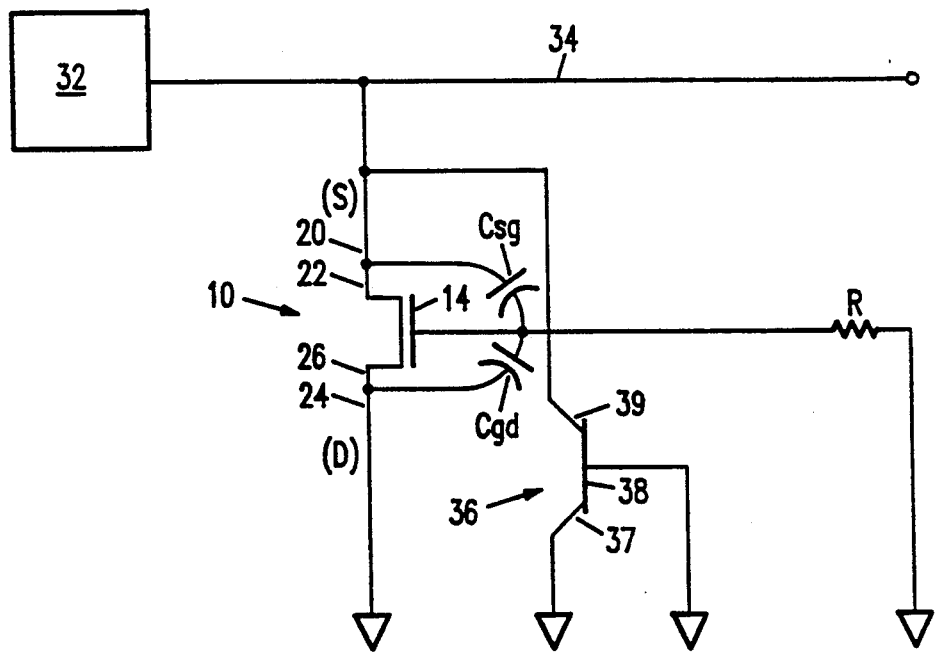
FIG. 2 is an ESD protection circuit using an MOS device with LDD regions according to the prior art.

FIGS. 3 through 7 show a sequential series of structures in a CMOS fabrication process. The purpose of the sequence is to illustrate how an N channel non-LDD devices can be simultaneously fabricated with other LDD MOS devices on an integrated circuit in a CMOS process flow.

Referring to FIGS. 3A through 3C, cross section views of an N channel LDD device, a complementary P channel device, and a non-LDD device are shown respectively at an initial stage in the fabrication process. In FIG. 3A, the N channel LDD device 100 includes a gate oxide 101 and a gate 102 built on a P type substrate 104. In FIG. 3B, the P channel device 110 includes a gate oxide 113 and a gate 114 which is built on an N well 112 within substrate 104. In FIG. 3C, the non-LDD device 120 includes a gate oxide 121 and a gate 122 built on substrate 104.

Referring to FIGS. 4A through 4C, cross sectional views of the N channel LDD device, the complementary P channel device, and the non LDD device are respectively shown after a light N type doping implant. In FIG. 4A, a first N− lightly doped region 105 and a second N− lightly doped region 106 are formed adjacent gate 102 during the N dopant implant. In FIG. 4B, prior to the N dopant implant, a resist layer 116 is placed over the device. As a result, the N type well 112 is protected from the N type implant and its dopant concentration level remains unchanged. In FIG. 4C, a resist 124 is placed around the gate 122 a predetermined lateral distance from the gate. The lateral distance should be equal to or greater than the later to be formed spacer oxide plus an allowance for processing alignment and lateral dimension variance. In a preferred embodiment, the lateral distance of the resist from the gate is approximately 2.0 microns. Accordingly, after the N implant, lightly doped N regions 125 and 126 are formed the predetermined lateral distance from the gate 122 Thereafter, the resist 124 and 116 are removed.

Although not described herein, it would be obvious to one skilled in the art to add the additional processing steps of forming a resist layer over N channel devices 100 and 120 followed by a P type doping. These additional steps would be performed if a P channel having an LDD structure were desired.

Referring to FIGS. 5A through 5C, cross section views of the N channel LDD device, the complementary P channel device, and the non-LDD device respectively are shown after a blanket oxide layer 130 is formed over the substrate 104.

Referring to FIGS. 6A through 6C, a cross section view of the N channel LDD device, the complementary P channel device, and the non-LDD device are respectively shown after substantial removal of the blanket layer 130 using an oxide etch step. A spacer oxide 132, however, is not removed from the gate regions 102, 114 and 122 of devices 100, 110 and 120 respectively due to the differential oxidation rates on the highly doped polysilicon gates versus the lightly doped drain and source regions of the devices.

In FIG. 6A, heavily doped N+ regions 135 and 136 are formed in the substrate by a heavy N+ doping. In FIG. 6C, heavily doped N+ regions 135 and 136 are formed during the same doping step, thus forming the N+ source and drain regions of device 120. Regions 137 and 138 beneath the spacer oxide 132 are shielded from the N+ dopant and therefore maintain the same dopant profile as the P type substrate 104. This completes the processing steps for the LDD N channel MOS device 100 and the non-LDD N channel MOS device 120. Resist layer 163 protects the P channel device 110 from the implant.

Referring to FIGS. 7A through 7C, a view of the N channel LDD device, the complementary P channel device, and the N channel non-LDD device is shown. In the final processing steps, a resist layer 109 is placed over the N channel LDD device 100 and another resist layer 129 over the non-LDD device 120. Thereafter, P+ regions 117 and 118 are formed in the N well 112 during a P type doping implant. Thereafter, the resists layers 109 and 129 are respectively removed. Subsequent high temperature processing steps provides for P+ underlap of the gate 114.

Accordingly, the non-LDD 120 structure is formed using the same set of processing steps that are used to build LDD CMOS circuits. The only deviation from the normal process flow is the formation of resist 124 over device 120 as described above in relation to FIG. 7C. This, however, occurs concurrently with the formation of the other resist layer, 116, and therefore does not require any additional processing steps or masks.

Figure 8:
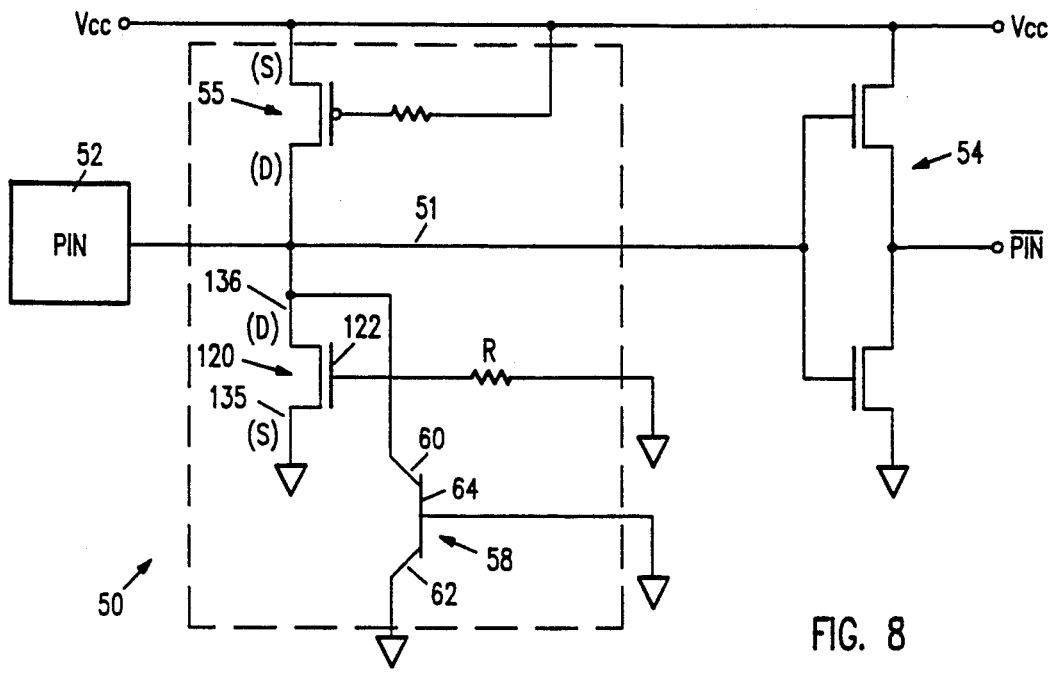
FIG. 8 is an ESD protection circuit according to one embodiment of the present invention.

Referring to FIG. 8, an ESD protection circuit according to the present invention is shown. The protection circuit 50 is coupled to a data line 51 between an input pin 52 and a circuit to be protected 54. The protection circuit 50 includes the N channel non-LDD device 120 having its drain 136 coupled to pin 52 and its source 135 coupled to ground and gate 122 coupled to ground through a series resistance R. R is a resistor formed by the diffusion of source and drains of the transistor. A bipolar transistor 58, parasitic to and in parallel with the non-LDD device 56, has its collector 60 coupled to pin 52, its emitter 62 connected to ground, and its base 64 connected to ground in common with the gate of non-LDD device.

A P channel device 55 has its source and gate coupled to power rail Vcc and its drain coupled to the pin 52. The P channel device 55 provides a parasitic PNP bipolar transistor which is normally off during an ESD event. During normal operation, however, the P channel device 55 provides a clamping diode to clamp transient over voltages on the Vcc rail.

Figure 9:
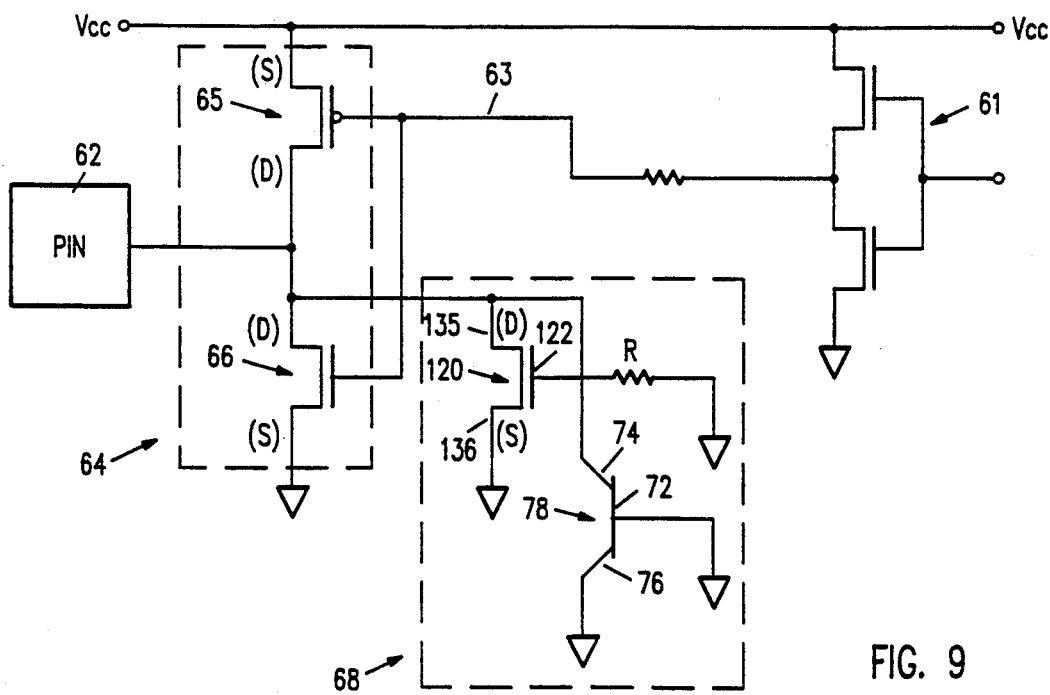
FIG. 9 is an ESD protection circuit according to another embodiment of the present invention.

Referring to FIG. 9, a protection circuit using a non-LDD device for protecting the output circuitry of an IC from ESD at an output pin is shown. The output circuitry of the IC includes an output circuit 61 coupled to data line 63 and an output buffer 64. The output buffer 64 includes a P channel device 65 having its source coupled to rail Vcc, its gate coupled to data line 63, and its drain coupled to the pin 62, and an N channel LDD device 66 having its drain coupled to pin 62, its gate coupled to data line 63, and its drain source to ground.

The protection circuit 68 includes the N channel non-LDD device 120, with its drain 130 coupled to pin 62, and its gate 122 through diffused resistance R and source 136 coupled to ground. A bipolar transistor 72, parasitic to and in parallel with the non-LDD device 70, has its collector 74 coupled to pin 62, its emitter 76 connected to ground, and its base 78 connected to ground in common with the gate of the N channel non-LDD device 120.

Figure 10:
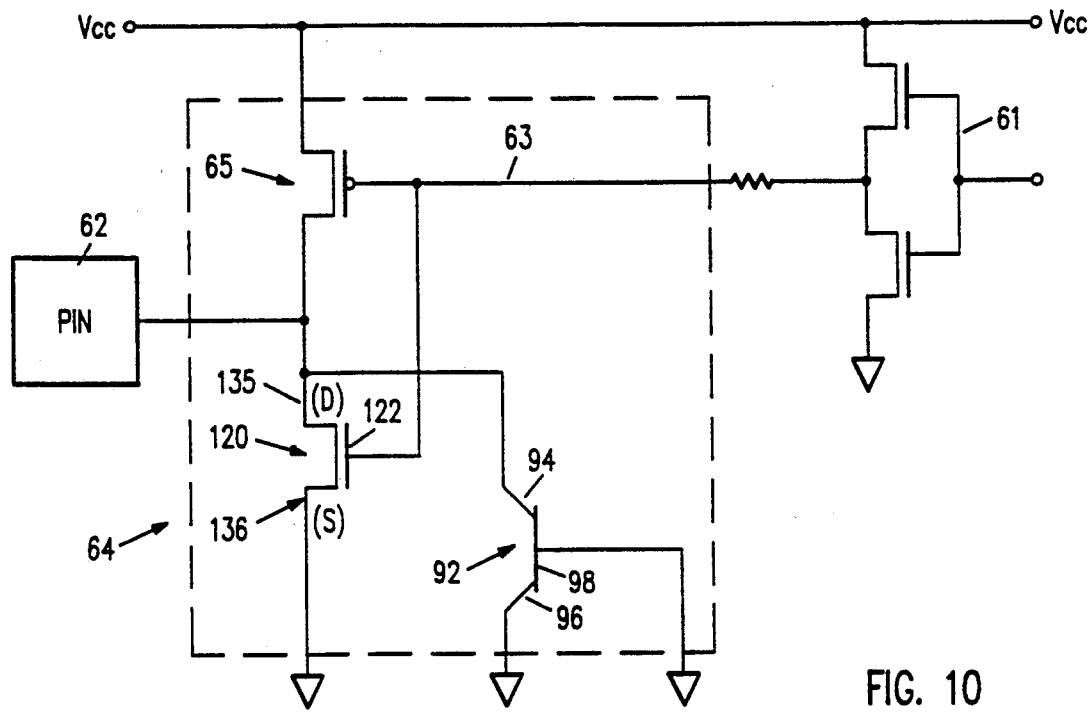
FIG. 10 is an ESD protection circuit according to another embodiment of the present invention.

Referring to FIG. 10, an ESD protection circuit according to another embodiment of the present invention is shown. In this alternative embodiment, the N channel LDD device 66 of FIG. 9 is replaced with N channel non-LDD device 120. Device 120 has its drain 135 coupled to pin 62, its source 136 coupled to ground and its gate 122 coupled to the data line 63. R is the channel resistance of the data line driver 61 in series with the parasitic-resistance of data line 63. A bipolar transistor 92, parasitic to and in parallel with non-LDD device 120, has its collector 94 coupled to pin 62, its emitter 96 coupled to ground, and its base 98 coupled to ground. Thus, N channel non-LDD device 120 functions as both part of the output driver 64 and as an ESD protection circuit.

Figure 11:
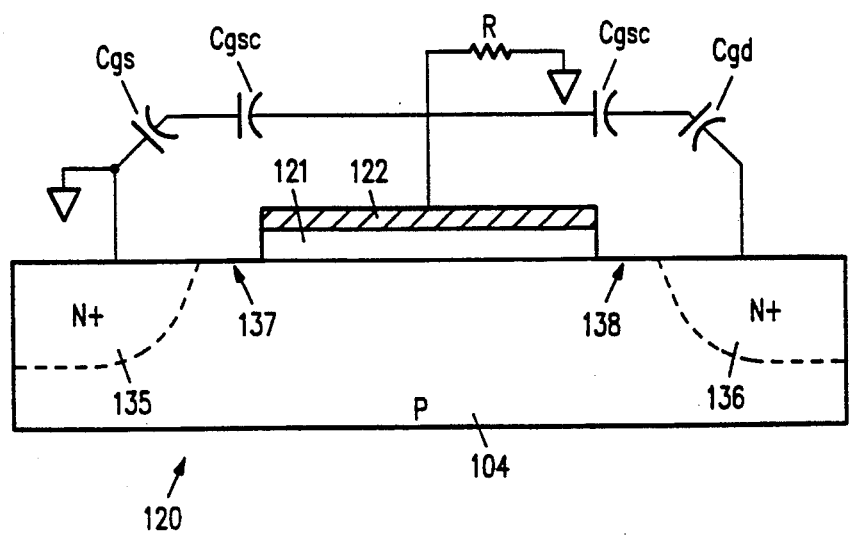
FIG. 11 is a circuit model of the non-LDD device according to the present invention.

Referring to FIG. 11, a circuit model of the non-LDD MOS device 120 as configured in the ESD protection circuits of FIGS. 8,9 and 10 is shown. In the model, the gate 122 of the non-LDD MOS device 120 is coupled to ground through the diffused resistance R. During an ESD event, a capacitance charge across the gate-drain (Cgd) and the gate-undoped region 138 (Cgsc) is dissipated. Similarly, a capacitance charge across the gate-source (Cgs) and the gate-undoped region Cgsc is dissipated. Since the non-LDD MOS device 120 is symetrical, it is believed approximately half of the ESD event is dissipated across the drain and the other half is dissipated across the source. Thus a voltage of approximately one half the ESD is present at the gate 122 of the device.

The non-LDD structure 120 operates in a similar manner as the LDD MOS device as described in the prior art, but with several major advantages. In particular, when used in the ESD protection circuits of FIGS. 8, 9, and 10, the highly doped (N+) regions 130 and 136 of the non LDD structure 120 provides a parasitic bipolar transistor with a reduced diode breakdown threshold. As a result, the protection circuit is activated at smaller magnitudes of ESD. Second, once the non LDD device is activated, the highly doped (N+) regions 135 and 136 have a much greater emitter efficiency than the prior art MOS devices with LDD regions. Thus, the amount of ESD that can be dissipated is greatly increased. Third, the initial voltage as created by an ESD event across the gate oxide 121 of the non-LDD device 120 is significantly reduced. With the addition 0.2 micron undoped regions 137 and 138, the initial voltage 13 present across a thicker oxide, namely the regions 137 and 138, in effect increase the gate oxide thickness for the initial transient.

Breakdown voltage of this oxide is higher than that of the gate oxide because it is thicker. The gate oxide is protected because the voltage is seen across this thick oxide not the gate oxide itself.

Other embodiments of the invention will be apparent to those skilled in the art from a consideration of this specification or practice of the invention disclosed herein. It is intended that the specification and examples be considered as exemplary only, with the true scope and spirit of the invention being indicated by the following claims.

What is claimed is:

1. A process of fabricating an integrated circuit on a semiconductor substrate, the integrated circuit having at least one pin and at least one power rail, the process comprising the steps of:

fabricating lightly doped drain (LDD) devices arranged in a pattern on a substrate of a first conductivity type;

coupling said LDD devices to a pin of the integrated circuit; and fabricating a non-LDD metal oxide semiconductor (MOS) device on said substrate, said non-LDD MOS device being coupled between said pin and a power rail of the integrated circuit, said non-LDD MOS device having a highly-doped source region, a highly-doped drain region and a gate region, each of said highly-doped source and drain regions being separated from said gate region by an undoped region, wherein in the event of an ESD occurrence at the pin, a portion of the ESD is dissipated through the non-LDD MOS device to said power rail.

2. The process of claim 1, wherein the step of fabricating one of said non-LDD MOS devices on the integrated circuit (IC) comprises the steps of:

forming a gate oxide and a gate on the substrate, said gate oxide and said gate defining sidewalls on said substrate;

forming said highly doped source and drain regions of a second conductivity type in said substrate a predetermined lateral distance from said sidewalls;

coupling a first of said highly doped source and drain regions to the pin of the IC; and coupling a second of said highly doped source and drain regions to the rail of the IC, wherein, in the occurrence of an ESD event at the pin, said first highly doped region, said channel region, and said second highly doped region form a conductive path to dissipate the ESD between the pin and the rail, thereby protecting said other LDD devices on the integrated circuit.

3. The process of claim 2, wherein said step of forming said highly doped source and drain regions comprises the steps of:

forming a spacer oxide of said predteremined thickness around said sidewalls of said gate on the substrate;

using said spacer oxide as a mask, introducing impurities of a second type into said substrate so that said highly doped source and drain regions are formed said predetermined lateral distance from said sidewalls in said substrate.

4. The process of claim 1, wherein said steps of fabricating said LDD and non-LDD devices occur substantially concurrent with one another.

5. A MOS process flow for forming a lightly doped drain (LDD) MOS device of a first conductivity type, and non-LDD MOS device of the first conductivity type, comprising the steps of:

forming a first gate oxide and first gate on a first portion of a substrate of a second conductivity type;

forming a second gate oxide and second gate on a second portion of said substrate;

forming first lightly doped source and drain regions of said first conductivity type adjacent said first gate oxide and first gate in said first portion of said substrate;

forming second lightly doped source and drain regions of said first conductivity type a predetermined lateral distance from said second gate oxide and said second gate in said second portion of said substrate such that each of said second lightly doped source and drain regions is separated from said gate region by an undoped region;

forming a first spacer oxide around said first gate oxide and first gate, said first spacer oxide having a lateral dimension substantially equal to said predetermined lateral dimension;

forming a second spacer oxide around said second gate oxide and second gate, said second spacer oxide having a lateral dimension substantially equal to said predetermined lateral dimension;

using said first spacer oxide as a mask, forming highly doped regions of said first conductivity type within said first lightly doped source and drain regions, thus forming a LDD MOS device; and using said second spacer oxide as a mask, forming highly doped regions of said first conductivity type within said second lightly doped source and drain regions such that each of said highly-doped regions is separated from said gate region by said undoped region, thus forming an non-LDD MOS device.

6. The MOS process flow of claim 5, further comprising the step of forming a complementary MOS device having a channel of a second conductivity type within a well of said first conductivity type formed in said substrate of said second conductivity type.

7. The MOS process flow of claim 5, wherein said predetermined lateral dimension is 0.2 microns.

8. The MOS process flow of claim 5, wherein said second conductivity type is N type.

9. The MOS process flow of claim 5, wherein said second conductivity type is P type.

* * * * *